United States Patent
Cranford, Jr. et al.

(10) Patent No.: US 7,389,192 B2
(45) Date of Patent: *Jun. 17, 2008

(54) DETERMINING DATA SIGNAL JITTER VIA ASYNCHRONOUS SAMPLING

(75) Inventors: Hayden C. Cranford, Jr., Cary, NC (US); Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 145 days.

This patent is subject to a terminal disclaimer.

(21) Appl. No.: 11/427,940

(22) Filed: Jun. 30, 2006

(65) Prior Publication Data

US 2008/0004821 A1 Jan. 3, 2008

(51) Int. Cl.
*G06F 19/00* (2006.01)
(52) U.S. Cl. .................. 702/69; 702/106; 375/224; 375/226; 331/2; 331/11
(58) Field of Classification Search ............... 702/69, 702/79, 106, 189, 191; 375/224, 226, 371, 375/373, 376; 331/2, 11
See application file for complete search history.

(56) References Cited

U.S. PATENT DOCUMENTS

| | | | |
|---|---|---|---|
| 4,703,448 A | 10/1987 | Muething, Jr. | |
| 5,889,435 A | 3/1999 | Smith et al. | |
| 6,185,509 B1 | 2/2001 | Wilstrup et al. | |
| 6,295,315 B1 | 9/2001 | Frisch et al. | |
| 6,366,631 B1 | 4/2002 | Nakayama et al. | |
| 6,522,122 B2 | 2/2003 | Watanabe et al. | |
| 6,640,103 B1 | 10/2003 | Inman et al. | |
| 6,661,836 B1 | 12/2003 | Dalal et al. | |
| 6,728,311 B1 | 4/2004 | Waschura et al. | |
| 6,785,622 B2 | 8/2004 | Nygaard, Jr. | |
| 6,836,738 B2 | 12/2004 | Sepp et al. | |
| 6,841,985 B1 | 1/2005 | Fetzer | |
| 6,871,152 B2 | 3/2005 | Nygaard, Jr. | |
| 6,934,648 B2 | 8/2005 | Hanai et al. | |
| 6,995,621 B1 * | 2/2006 | Culler ..................... | 331/57 |
| 7,203,610 B2 * | 4/2007 | Tabatabaei et al. ........... | 702/69 |

(Continued)

OTHER PUBLICATIONS

U.S. Appl. No. 11/279,651, filed Apr. 13, 2006, Cranford, Jr. et al.

(Continued)

*Primary Examiner*—Bryan Bui
(74) *Attorney, Agent, or Firm*—Mitch Harris, Atty at Law, LLC; Andrew M. Harris; Casimer K. Salys

(57) ABSTRACT

A method for determining data signal jitter via asynchronous sampling provides a low cost and production-integrable mechanism for measuring data signal jitter. The data signal is edge-detected and sampled by a sampling clock of unrelated frequency the sampled values are collected in a histogram according to a folding of the samples around a timebase. The timebase is determined by sweeping to detect a minimum jitter for the folded data. The histogram for the correct estimated timebase period is representative of the probability density function of the location of data signal edges and the jitter characteristics are determined by the width and shape of the density function peaks. Frequency drift can be corrected by adjusting the timebase used to fold the data across the sample set.

9 Claims, 7 Drawing Sheets

U.S. PATENT DOCUMENTS

| | | |
|---|---|---|
| 2002/0103609 A1 | 8/2002 | Kuyel |
| 2002/0118738 A1 | 8/2002 | Whitlock |
| 2004/0143406 A1 | 7/2004 | Nishikobara et al. |
| 2005/0036578 A1 | 2/2005 | Heidel et al. |
| 2005/0069031 A1 | 3/2005 | Sunter et al. |
| 2005/0107970 A1 | 5/2005 | Franch et al. |
| 2005/0111536 A1 | 5/2005 | Cranford, Jr. et al. |
| 2005/0177758 A1 | 8/2005 | Stickle |
| 2006/0023778 A1 | 2/2006 | Bergman et al. |
| 2006/0069967 A1 | 3/2006 | Almy et al. |
| 2006/0251200 A1* | 11/2006 | Miller .................. 375/371 |

OTHER PUBLICATIONS

Jenkins, et al.,"An On-Chip Jitter Measurement Circuit with Sub-picosecond Resolution", Proceedings of ESSCIRC, Grenoble, France. Jan. 2005, 4 pages.

Restle, et al., "Timing Uncertainty Measurements on the Power5 Microprocessor", IEEE 2004 Solid-State Circuits Conference, Jun. 2004, 8 pages.

Xia, et al., "Self-Refereed on-chip Jitter Measurement Circuit Using Vernier Oscillators", Proceedings of the IEEE Computer Society Annual Symposium on VLSI, IEEE, 2005, US, 6 pages.

Ong, et al. "A Scalable On-Chip Jitter Extraction Technique" Proceedings of the IEEE VLSI Test Symposium 2004, IEEE, 2004, US, 6 pages.

Larsson, et al. "Measuring high-bandwidth signals in CMOS circuits", Electronics Letters, vol. 29, No. 30, Sep. 1993, IEEE, 2 pages.

Ho, et al., "Applications of On-Chip Samplers for Test and Measurement. of Integrated Circuits", 1998 VLSI Symposium, IEEE, 1998, 2 pages.

Takamiya, et al., "An On-chip 100GHz-Sampling Rate 8-channel Sampling Oscilloscope with Embedded Sampling Clock Generator", 2002 ISSCC, 3 pages.

Abaskharoun, et al., "Strategies for On-chip Sub-nanosecond Signal Capture and Timing Measurements", IEEE, 2001, US, 4 pages.

Ong, et al. "Jitter Spectral Extraction for Multi-gigahertz Signal", (DAC) IEEE, 2004, US, 6 pages.

* cited by examiner

DETERMINING DATA SIGNAL JITTER VIA ASYNCHRONOUS SAMPLING

This invention was made with Government support under NBCH3039004, DARPA. THE GOVERNMENT HAS CERTAIN RIGHTS IN THIS INVENTION.

CROSS-REFERENCE TO RELATED APPLICATIONS

This application is related to U.S. applications: Ser. No. 11/279,651 entitled "METHOD AND APPARATUS FOR DETERMINING JITTER AND PULSE WIDTH FROM CLOCK SIGNAL COMPARISONS" filed on Apr. 13, 2006 and issued as U.S. Pat. No. 7,286,947 on Oct. 23, 2007, Ser. No. 11/427,831, entitled "METHOD OF GENERATING AN EYE DIAGRAM FOR INTEGRATED CIRCUIT TRANSMITTED SIGNALS", and Ser. No. 11/427,860, entitled "METHOD AND APPARATUS FOR CONSTRUCTING A SYNCHRONOUS SIGNAL DIAGRAM FROM ASYNCHRONOUSLY SAMPLED DATA", both filed concurrently with this application, by the same Inventors and assigned to the same Assignee. The specifications of the above-referenced applications are incorporated herein by reference.

BACKGROUND OF THE INVENTION

1. Technical Field

The present invention relates generally to digital interface circuits, and more particularly, to circuits and systems that evaluate data jitter.

2. Description of the Related Art

Data jitter determination is necessary to evaluate the performance of high-speed interface components and interfaces, as well as other circuits where jitter affect the bit error rate (BER). Determining data jitter is also desirable in many circuits that determine the quality of a received or transmitted data signal that also adapt performance of an interface in order to accommodate or reduce a level of data signal jitter.

In laboratory environments, high-accuracy laboratory instruments may be used to determine the jitter of a signal via very stable reference clocks and long integration times. However, the challenge of probing a very high frequency data signal and/or high-impedance data signal is significant, as the effects of the probe must be accounted for in the measurements and probe characteristics can vary over time and the probe compensation model may not be accurate under actual measurement conditions. Further, significant circuit area can be consumed in the impedance-matched and isolated output pads that permit such precision measurements. Such equipment is expensive and it is typically unfeasible to incorporate the equivalent of such instrumentation within production circuits.

On-chip measurements of data jitter are either performed using an internal global clock or an external sample clock with an internal delay line. Use of the internal global clock is limited in that clock jitter and data jitter cannot be separated. When an external sample clock is used, the delay accuracy, and thus the accuracy of the jitter measurement, is difficult to control. Since one inverter delay is typically the shortest delay available for fabricating an internal delay line, the resolution of the jitter measurement is then limited to one inverter delay. When measuring the jitter level of low-jitter signals, the resolution of the delay line technique is insufficient for accurate results. Further, if a large delay range is provided, the area and power required can be quite large, since the delay is typically operating at a very high clock frequency.

It is therefore desirable to provide a method and apparatus for determining data signal jitter that is low cost, can be at least partially integrated in a production circuit with no probing error and can quickly determine the jitter level of a data signal.

SUMMARY OF THE INVENTION

The above-stated objectives of providing a low-cost apparatus and method for determining data signal jitter level is provided in a method and apparatus.

The method analyzes raw data provided by the apparatus, and the performance of the method may be distributed between a test circuit and a workstation computer or may be completely embedded in a test instrument or production integrated circuit.

The method collects values corresponding to edge positions of a data signal under measurement by sampling the output of an edge detector that receives the data signal under measurement using a sampling clock signal that differs at least slightly in frequency from rational multiples of the data rate.

The sampled edge data is analyzed according to a guess of the relationship between the periods/frequencies of the sampling clock and the data rate, and the guess is adjusted either over a range, or until an indication that the guess is correct is obtained, such as a jitter analysis indicating minimum.

The period obtained above is used to generate a timebase to fold the sampled edge data. The frequency or period of neither the sampling clock signal or data signal needs to be known in order to further analyze the edge data, only the relationship between the two, as determined by the method described above. However, if the frequency of the sampling clock signal is known to a sufficient degree of accuracy, then the data rate of the data signal under measurement can be determined from the timebase.

The values of the edge detector samples, which are an indication of the position of edges in the data signal, are then analyzed in accordance with the correct period, in order to generate a histogram of sampled data signal values on subintervals of the data period. The values are placed into histogram "bins" that correspond to each sub-interval (slice) of the overall data period. Once the histogram is generated, which corresponds to the probability density function of the data signal values over one period, the histogram yields a measure of the jitter. The width of the probability density function peaks indicates the peak jitter and the shape of the peaks reveals the characteristics of the jitter for both rising and falling edges.

Drift between the frequency of the sampling clock signal and the edge positions of the data signal can be removed from the analysis results by using a linear or other shift model to progress the guessed period across the sample set, and the exact frequency drift can be identified from the histogram having the minimum widths of peaks in the probability density function.

The sampling/edge-detection circuit can be included in a production die and the data collected by a workstation computer via direct probing or a boundary-scan data interface. Alternatively, a processing circuit or algorithm may be present or loaded into a production integrated circuit that includes a processor or a dedicated digital circuit use to conduct the above-described analysis. The analysis method may be embodied in a computer-program product containing stored program instructions for carrying out the steps of the method.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

Details of the invention and the uses thereof will be understood by a person of ordinary skill in the art, when reading the following detailed description of illustrative embodiment in conjunction with the accompanying drawings. Further objectives and advantages presented by the invention will be apparent in light of the following description and drawings, wherein like reference numerals indicate like components, and.

DESCRIPTION OF ILLUSTRATIVE EMBODIMENT

The present invention concerns the measurement of jitter of data signals, and in particular, the measurement of jitter in interface data signals. In order to produce accurate results, the capture of measurement data is generally performed by a sampling circuit within the interface (or other data-receiving circuit) rather than a separate test probe. However, the techniques of the present invention can be applied to and within test equipment, as well.

Primarily, the present invention provides new methods for analyzing data obtained by sampling a data signal under measurement with an asynchronous sampling clock. Rather than filtering the sampled data, as is done within a phase-lock loop (PLL) loop filter, the present invention resolves the sampled data to identify a relationship between the measured locations of data signal edges relative to the sampling clock and then determines the jitter of the measured data signal from the distribution of samples after folding the sampled data according to the identified clock to data signal relationship.

Therefore, the sampling clock used to sample the data signal under measurement and the edges of the data signal (and integer multiples of its data rate) must differ in frequency at least slightly and a sufficient number of samples must be collected so that jitter can be distinguished from variation due to slight frequency differences. Neither the data rate of the data signal under measurement nor the sampling clock period/frequency need be known in order to evaluate the jitter of the data signal. However, if highly stable frequency source with known frequency is employed for the sampling clock, then the data rate of the data signal may be computed from the results of the analysis.

Figure 1:
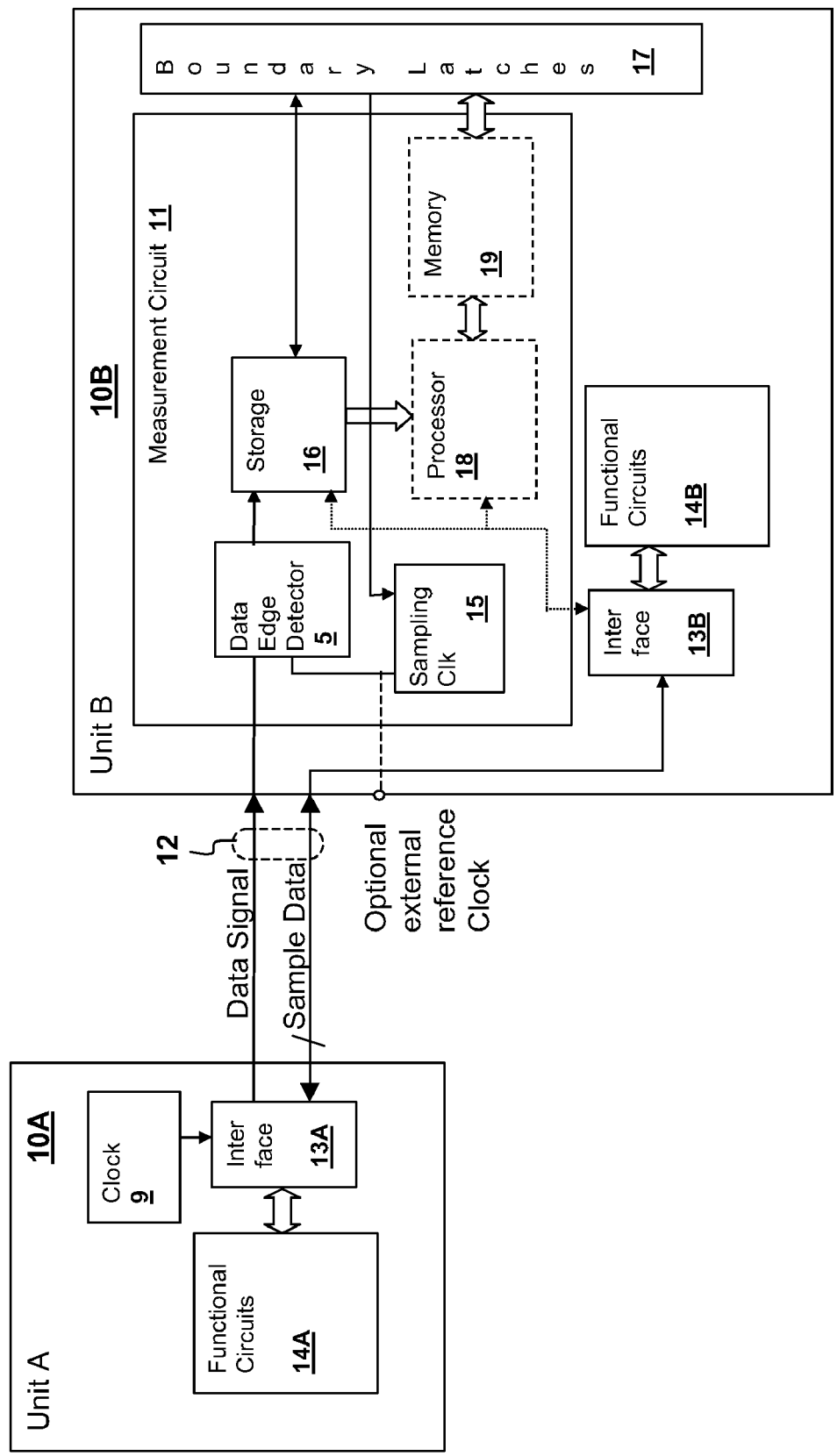
FIG. 1 is a block diagram of a first electronic unit connected by an interface to a second electronic interface in accordance with an embodiment of the invention.

With reference now to the figures, and in particular with reference to FIG. 1, there is depicted a block diagram of electrical units 10A and 10B connected by a wired interface or other channel 12 that includes one or more Data signals. Interface circuits 13A, 13B may be located within a device such as a computer peripheral, a computer system, or within integrated circuits interconnected within a system or may be a wireless device interface having a clock signal embedded in a received signal. Clock 9 provides for synchronous generation of data provided from electrical unit 10A. Functional circuits 14A, 14B do not generally form part of the present invention, but perform the functions associated with the normal operation of units 10A and 10B. Functional circuit 14B is included to illustrate that the techniques of the present invention can be applied to a functional device rather than a laboratory model. However, in some instances, the circuits required to perform the measurements of the present invention will already be present in functional circuits 14B of a particular electrical unit 10B without modification, and the use of such functional circuits to perform data collection as input to a method according to an embodiment the present invention are contemplated herein.

The circuit required for data collection is illustrated separately as a measurement circuit 11 and includes a data edge detector 5, a sampling clock 15 and a storage 16 for storing samples of edges of interface 12 Data signal collected from the output of edge detector 5 at edges of sampling clock 15. A processor 18 and memory 19 are optionally included for performing methods according to the present invention, or the raw data from storage 16 may be clocked out by a test system via boundary latches 17 or otherwise read from unit 10B via interface 13B, e.g., by electrical unit 10A as Sample Data over interface 12. Also, if processor 18 and memory 19 are included, and the sampled data is processed locally, interface 13B and/or boundary latches 17 may be read to retrieve the results of the analysis performed by a method according to the present invention.

Some degree of tuning of sampling clock 15 must generally be provided, or sampling clock 15 frequency must be chosen so that the frequency will not land on an exact multiple of the data rate of the measured data signal, thus generating a zero beat frequency that will yield only a signal dependent on the presence or absence of data signal edges in the folded data and not revealing the jitter. Sampling clock 15 is therefore shown coupled to boundary latches 17 in order to provide to least a single bit adjustment that can change the clock frequency of sampling clock 15 if needed to avoid sampling too close to a multiple of the data rate of the data signal under measurement. Sampling clock 15 may also be optionally provided from an external source such as a test system, especially if a measurement of the data rate of the measured data signal is also desired.

Figure 2:
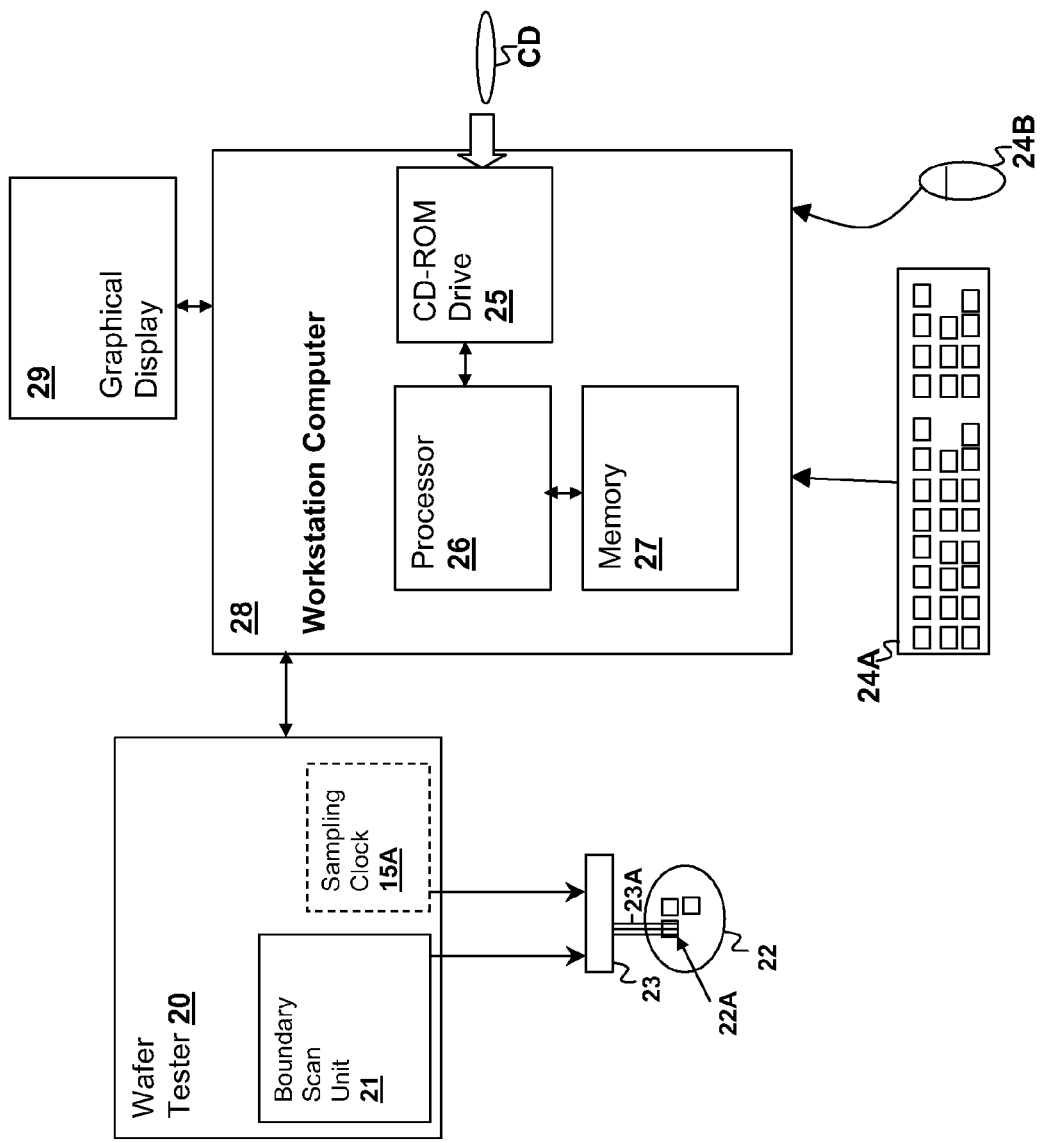
FIG. 2 is a pictorial diagram of a manufacturing tester and workstation computer connected to a device under measurement implementing a method in accordance with an embodiment of the present invention.

Referring now to FIG. 2, a wafer test system, in which methods according to an embodiment of the present invention are performed, is depicted. A wafer tester 20 includes a boundary scan unit 21 for providing stimulus to and reading data from a die 22A on a wafer under test 22, via a probe head 23 having electrical test connections 23A to die 22A.

An optional sampling clock 15A is included for optionally providing a stable and accurate clock to the above-described sampling circuits within die 22A, to either improve the measurement results, or to provide additional measurement of the data rate of the data signal under measurement.

A workstation computer 28, having a processor 26 coupled to a memory 27, for executing program instructions from memory 27, wherein the program instructions include program instructions for executing one or more methods in accordance with an embodiment of the present invention, is coupled to wafer tester 20, whereby the sampled clock data (or analysis results from processor 18 and memory 19 of FIG. 1) can be retrieved. A CD-ROM drive 25 is also coupled to processor 26 for transfer of program products from media such as CD-ROM CD that contain program instructions for executing methods in accordance with embodiments of the present invention.

Workstation computer 28 is also coupled to a graphical display 29 for displaying program output such as the jitter computed by embodiments of the present invention, as well as graphical data such as the graphs depicted in FIGS. 5A-5E and 7A-7D as described below. Workstation computer 28 is further coupled to input devices such as a mouse 24B and a keyboard 24A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 28. Further, workstation computer 28 may be coupled to wafer tester 20 by such a network connection.

While the system of FIG. 2 depicts a configuration suitable for sequential test of a plurality of dies on a wafer, the depicted system is illustrative and not limiting to the present invention. Probe head 23 may be a multi-die full wafer probe system, or may comprise multiple probe heads for simultaneously testing multiple wafers on a single or multiple die basis. Additionally, while boundary scan data retrieval is illustrated, the techniques of the present invention may also be applied to a data interface including the loading of program code to memory 19 (FIG. 1) for execution by processor 18 (FIG. 1) incorporated on die 22A to an interface other than boundary scan unit 21, for example, via a dedicated test interface device that retrieves sampled clock data from storage 16 (FIG. 1) or test results from memory 19.

Figure 3:
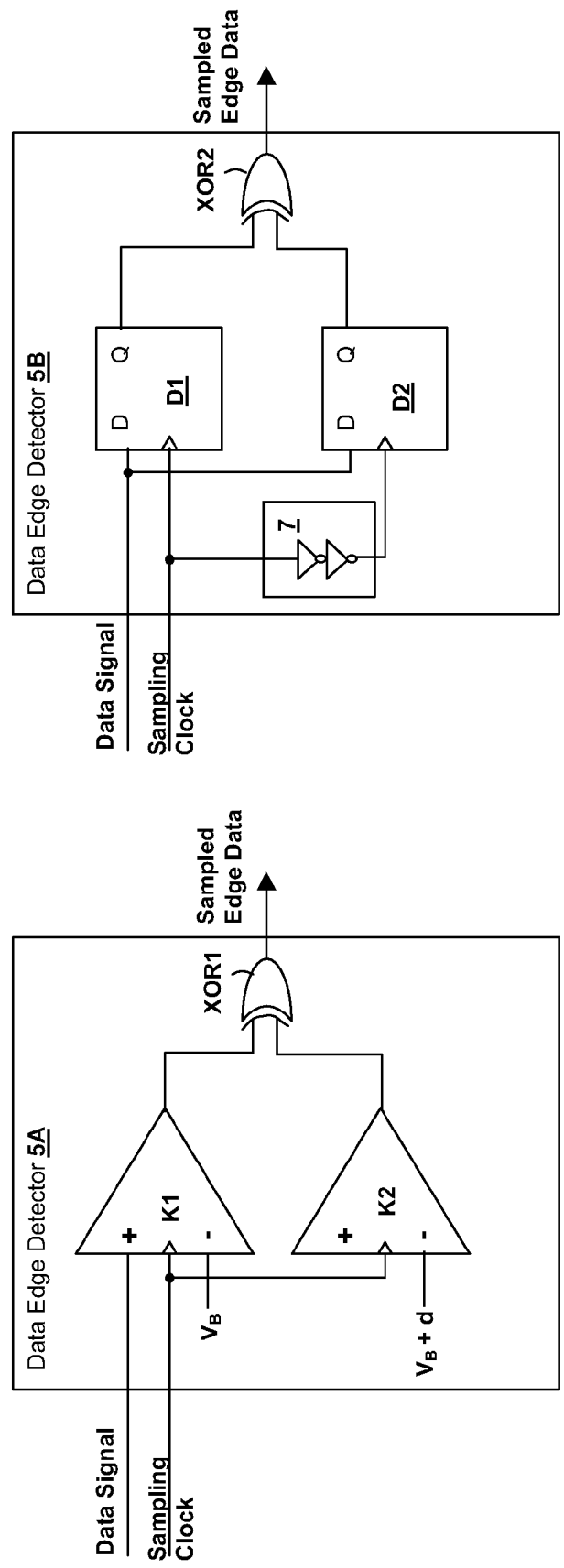
FIGS. 3A and 3B are schematics of differing edge detectors that may be employed in second electronic interface 10B of FIG. 1 in accordance with embodiments of the invention.

Referring now to FIG. 3A, a data edge detector circuit 5A as may be employed in measurement circuit 11 of FIG. 1 is depicted. Data edge detector 5A receives the Data Signal under measurement and the sampling clock signal. A first comparator K1 compares Data Signal to a reference bias voltage $V_B$ to provide an output that changes when Data Signal changes logical state. A second comparator K2 compares Data Signal to a slightly differing reference bias voltage $V_B+d$, causing the output of comparator K2 to change either slightly earlier or later than the output of K1, depending on the direction of the transition in Data Signal. A logical exclusive-OR gate XOR1 produces a logical high output only when the outputs of comparators K1 and K2 differ, thus providing an output signal that contains pulses in the near vicinity of the transitions of Data Signal.

Referring now to FIG. 3B, a data edge detector circuit 5B as may be alternatively employed in measurement circuit 11 of FIG. 1 is depicted. Data edge detector 5B receives the Data Signal under measurement and the sampling clock signal. A first latch D1 latches the value of the Data Signal at an edge of the Reference Clock signal and a second latch D2 latches the value of the Data Signal at an edge of a delayed version of the Reference Clock signal as provided by delay 7. A logical exclusive-OR gate XOR2 produces a logical high output only when the outputs of latches D1 and D2 differ, thus providing an output signal that contains pulses in the near vicinity of the transitions of Data Signal.

In contrast to the techniques disclosed in the above-incorporated U.S. patent application "METHOD AND APPARATUS FOR DETERMINING JITTER AND PULSE WIDTH FROM CLOCK SIGNAL COMPARISONS", for the techniques of the present invention, a much larger sample set is required. The sample set must be larger so that a reasonable number of samples of the outputs of edge detector 5A or 5B is captured. Since the edge detector output forms a very small portion of the overall data period, the number of samples that must be taken in order to collect a sufficient number of edges for jitter measurement will be very large. In order to conserve storage space, edge location values such as those stored in storage 16 of FIG. 1 may be stored with an encoding mechanism such as a run-length limited (RLL) or other compression technique that takes advantage of the relative sparse presence of detected edges in the data set.

Figure 4:
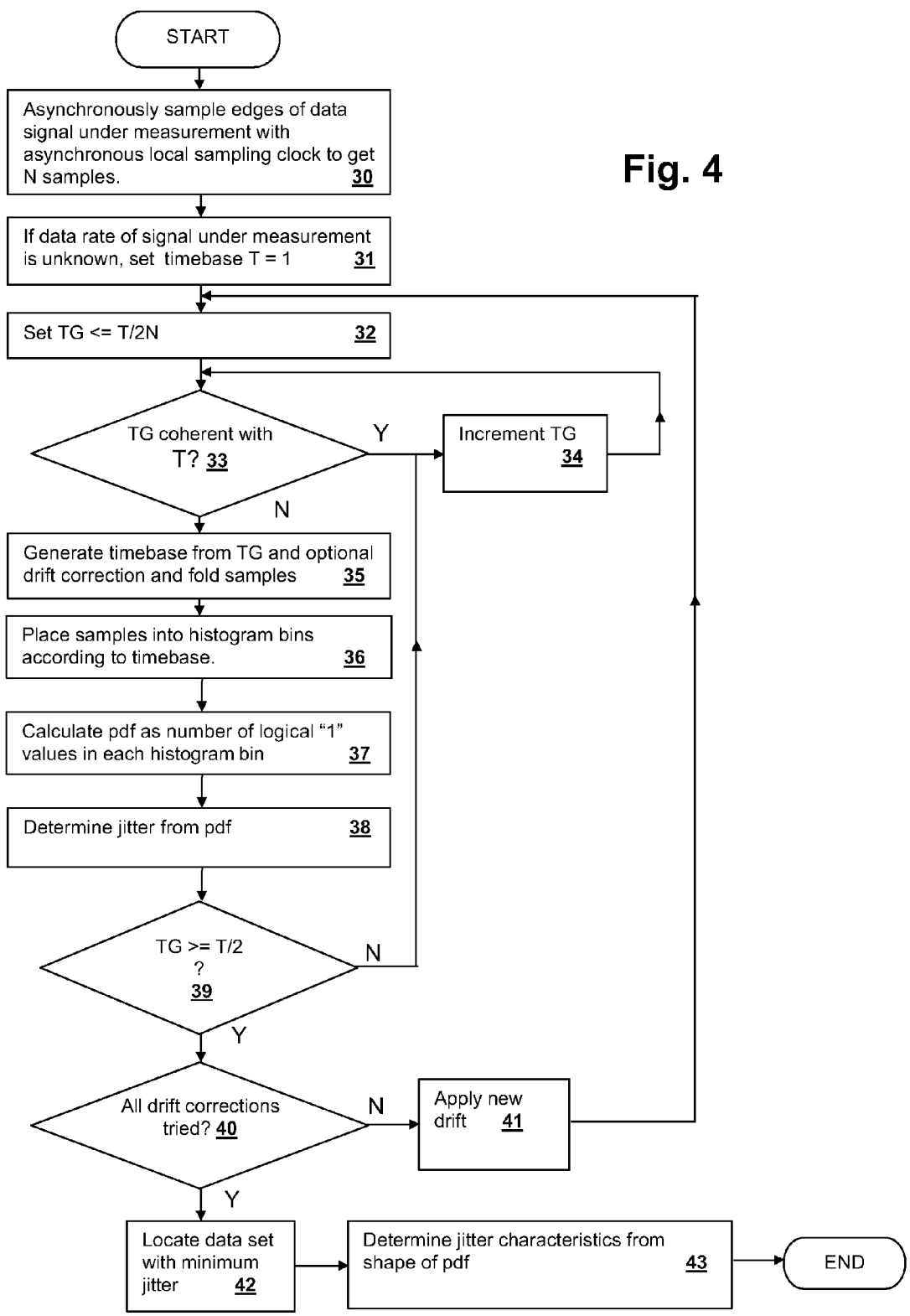
FIG. 4 is a flowchart illustrating a method in accordance with an embodiment of the invention.

Referring now to FIG. 4, a method according to an embodiment of the present invention is illustrated in a flowchart. The edges of the data signal under measurement are sampled with an asynchronous local sampling clock (step 30) to obtain N samples. If the period of the data signal under measurement is known, then T is set to that period, otherwise T is set to 1 (step 31). Next, an initial guess of the sampling clock period TG is made as a number<=T/2N (step 32). A coherency check is made on the relationship between T and TG to reject clock period guesses that are closely related (decision 33) and if the coherency check fails, TG is incremented (step 34). Next, a timebase is generated from TG and an optional drift correction is applied and the samples are folded to a unit interval using the optionally drift-corrected timebase (step 35). The samples are then binned into histogram bins according to the sub-intervals indicated by the timebase (step 36) and the probability density function (pdf) computed by the count of logical "1" values in each bin (step 37). The jitter determined from the pdf (step 38).

The above-described steps from decision 33 to step 38 are repeated for all increments of TG up to T/2 (decision 39). Also, until all desired drift corrections are applied (decision 40), new drift corrections are applied (step 41) and step 32 through decision 39 are repeated. After the edge position data values have been analyzed over all timebase periods and drift corrections, the TG period for which the minimum jitter is present (step 42) is taken as the correct clock period and further jitter characteristics are determined from the shape of the pdf (step 43). The RMS value of the jitter can be determined from the shape of the pdf peak, and further characteristics, such as sinusoidal jitter profiles can be observed from the overall shape of the distribution.

At one particular TG value, the jitter value will drop dramatically, with a sharp peak in the pdf indicating that TG is at the correct value per step 42. Even a small deviation in period from the actual period of the sampling clock will result in an essentially equal distribution of values across the bins if a sufficient number of values are collected, and thus a high jitter value for the data signal under measurement.

Figure 5B:
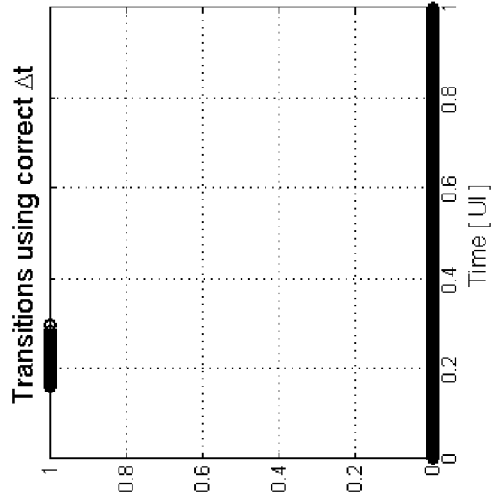
FIGS. 5A-5E are graphs depicting data processing operations and measurements in a method according to an embodiment of the present invention.
Figure 5A:
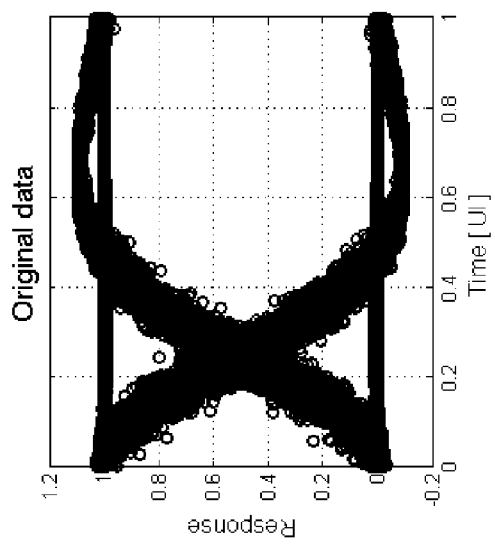

Referring now to FIGS. 5A-5D, the graphs depicted illustrate the method described above with respect to FIG. 4. FIG. 5A shows the input data signal when sampled at the correct TG, provided here for illustrative purposes. The nominal crossing of the large bands seen in the data set corresponds to the location of the nominal data rate with respect to the sampling clock period.

FIG. 5B shows the distribution of accumulated sample values (corresponding 1V and 0V) after folding with the correct estimated period. The overlapping regions correspond to the range of time across which data signal transitions are spread due to the jitter. The period in the graphs is expressed as the modulo remainder of TG/T, which provides a unit interval of reference for the folded data.

Figure 5D:
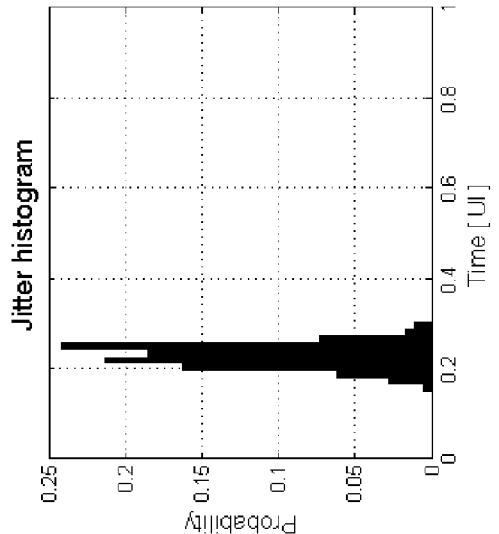
Figure 5C:
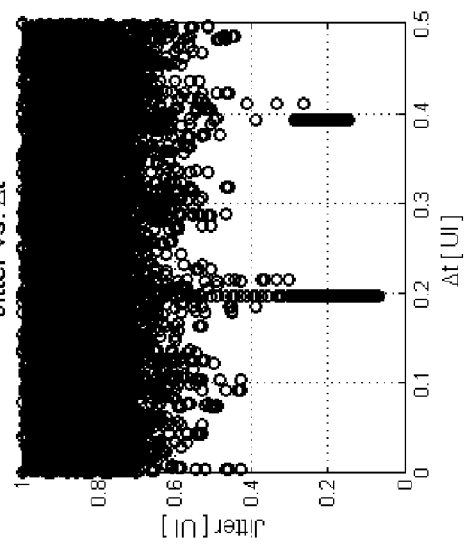

FIG. 5C shows a graph of estimated jitter vs. sampling clock period. The sharp drop in jitter at approximate period ?t=0.2 indicates the correct sampling clock period. FIG. 5D shows the distribution of edge values in the histogram after finding the correct period.

Figure 5E:
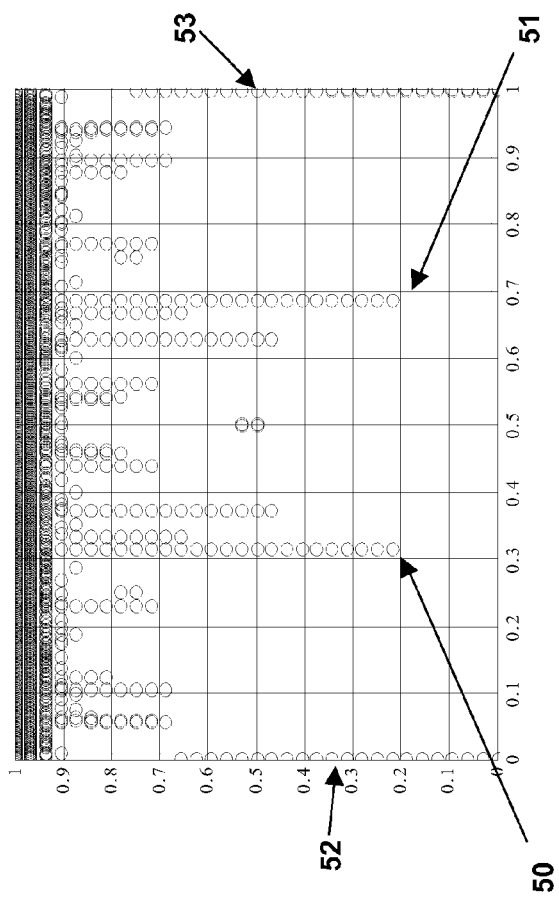

Referring now to FIG. 5E a graph of jitter versus sampling clock period is shown across the unit interval from a zero modulus period 52 corresponding to a zero difference in periods between the data signal under measurement and the sampling clock, to a period 53 that indicates a difference in clock periods corresponding to one clock being twice the frequency of the other. (The 1.0 and 0 values are essentially the same point on the unit interval since mod [2T/T]=0.)

The very low jitter values at periods 52 and 53 are due to the DC value yielded from the sample set being read at effective identical positions within the waveform of the clock under measurement, i.e. coherent sampling, which is rejected by the above-described method in step 33 of FIG. 4. Periods 50 and 51 are the correct estimated periods, having the minimum amount of actual jitter and correspond to modulus of the ratio between the data signal data rate and the sampling clock periods. As can be observed from the figure, the graph is symmetrical around T/2, so the estimated period only needs to be swept over half of the unit interval. The other drops in jitter value correspond to products of harmonic relationships of higher order between the guessed period, the sampling clock and the data signal data rate.

Figure 6:
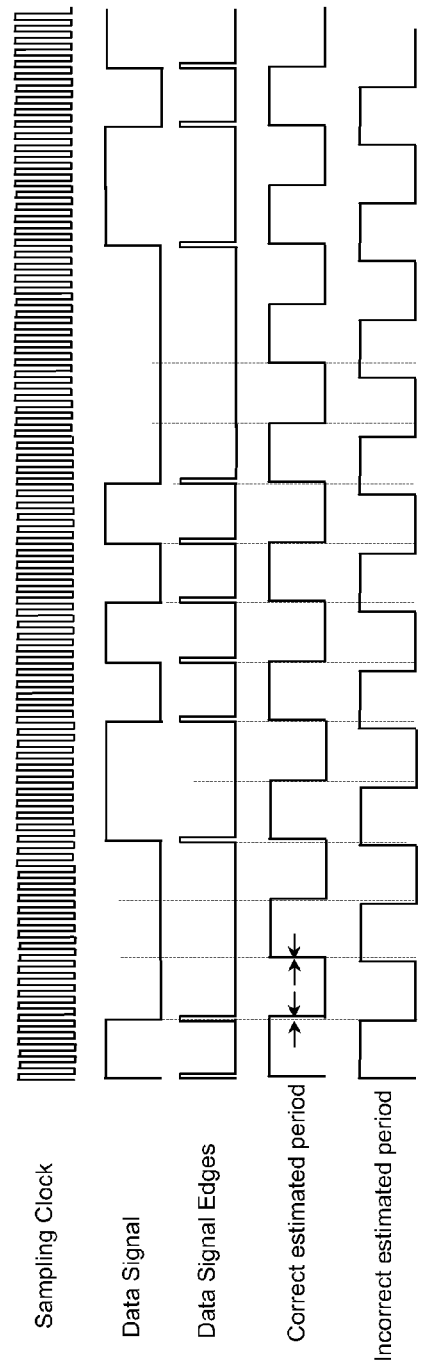
FIG. 6 is a timing diagram illustrating a method of determining estimated clock periods in accordance with an embodiment of the invention.

Referring now to FIG. 6, a pictorial diagram illustrating the folding technique is shown. The illustration is a simplified diagram that illustrates a Sampling Clock signal providing an oversampling factor of approximately, but not exactly 10, where in actuality the data signal may be oversampled or undersampled. The Data Signal is the actual data signal under measurement and Data Signal Edges signal is the output of edge detector 5 of FIG. 1. The waveforms beneath, though drawn as continuous waveforms, represent samples in the data set provided by sampling the Data Signal Edges signal with the Sampling Clock signal and selecting specific samples from the data set to "reconstruct" the edges of the Data Signal Edges signal. In the Correct Estimated Period signal, the samples are chosen according to a period that corresponds to the correct relationship between the Data Signal period (data rate) and the Sampling Clock signal period, and therefore only jitter and any deviations in the edge detector pulse width or delay will cause differences between the expected position of an edge and the actual position of the edge in the data set (illustrated by the arrows). For the Incorrect estimated period signal illustrated, the progressive (and cyclic) edge differences will yield a "jitter" distribution that is uniform for large enough sample sets, as the distance between the expected edge locations and the actual edge locations cycle through a full range of phase differences. Therefore, the minimum jitter distribution will occur when the guessed period is equal to the correct sampling clock period.

Figure 7A:
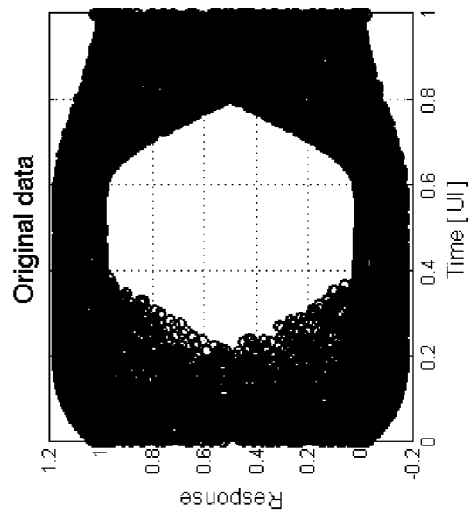
FIGS. 7A-7D are graphs depicting operations in correcting frequency drift in a method according to an embodiment of the present invention.
Figure 7B:
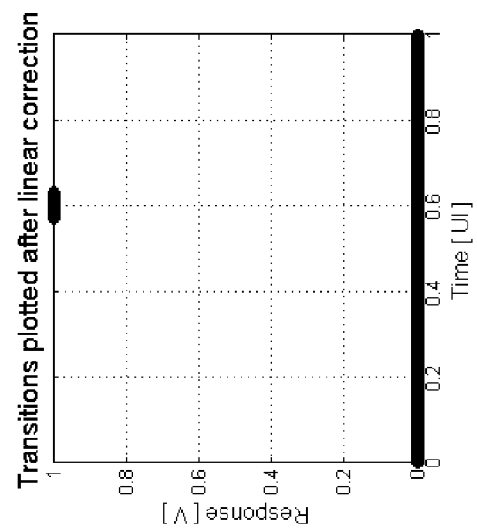
Figure 7C:
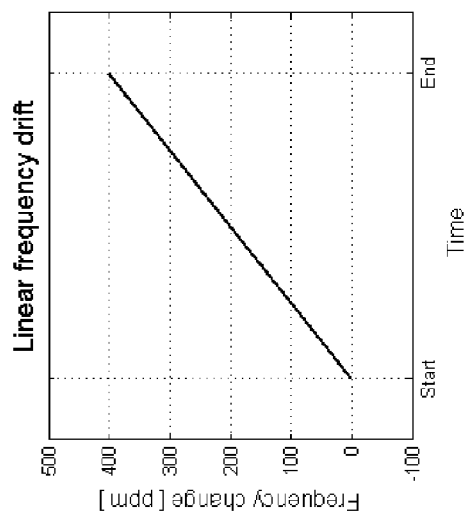
Figure 7D:
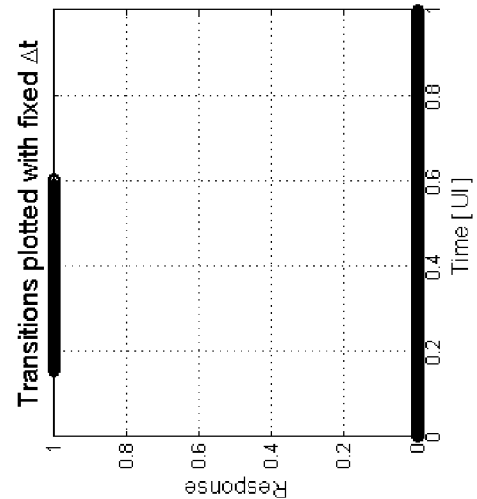

FIGS. 7A-7D illustrate the application of a frequency drift correction function in the methods of the present invention. FIG. 7A depicts an optional drift correction function used to increase or decrease the guessed period progressively over the sample set during the method described above. FIG. 7B illustrates the distribution of the data signal edge samples without drift correction. FIG. 7C illustrates the spread of the data signal edges in time without drift correction and corresponds to FIG. 5B described above. FIG. 7D shows the spread of data signal edges after the proper drift correction has been applied.

The description provided above constitutes a description of the preferred embodiments of the invention, but the invention is not limited to the particular implementations shown or described. Those skilled in the art, having seen the above description and accompanying drawings, will understand that changes in form, structure and other details, as well as the order of operation of any operative steps may be varied without departing from the spirit and scope of the invention.

What is claimed is:

1. A method of measuring jitter of a data signal, comprising:

detecting edges of said data signal to provide an indication of presence of said edges;

collecting samples of values of said indication at regular intervals having a sampling period differing from a multiple of a data rate of said data signal;

determining a timebase period corresponding to a relationship between said sampling period and said data rate;

grouping said values according to said timebase period into bins of a histogram corresponding to sub-intervals of said data rate; and analyzing said histogram to determine a level of said jitter of said data signal.

2. The method of claim 1, wherein said analyzing comprises:

determining a width of a distribution of said values in said histogram in a region of transition of said data signal; and computing said jitter level from said width.

3. The method of claim 1, wherein said determining said timebase period comprises:

computing an indication of an amount of effective jitter of said data signal for said estimated period; and adjusting said timebase period until a timebase period yielding a minimum amount of said effective jitter is found.

4. The method of claim 3, further comprising changing said timebase period across said samples during said grouping to correct for drift in at least one of a width of said regular intervals and said data rate.

5. The method of claim 1, wherein said collecting is performed using a sampling clock having a known sampling period, and further comprising calculating said data rate of said data signal from said timebase period.

6. The method of claim 1, wherein said detecting is performed by generating a pulse commencing when said data signal crosses a first transition voltage level and ending when said data signal crosses a second transition voltage level.

7. The method of claim 1, wherein detecting is performed by generating a pulse commencing when a sampling clock samples a change in said data signal and ending after expiration of a predetermined delay.

8. The method of claim 1, wherein said analyzing comprises:

determining a standard deviation of a distribution of said values in said histogram in a region of transition of said data signal; and computing an RMS jitter level from said width.

9. The method of claim 1, wherein said analyzing comprises:

observing a shape of said histogram in a region of transition of said data signal; and determining a non-random characteristic of said jitter from said shape.

* * * * *